United States Patent
Weiss

(10) Patent No.: US 8,917,108 B2
(45) Date of Patent: Dec. 23, 2014

(54) APPARATUS FOR MONITORING OPERATING PARAMETERS OF INTEGRATED CIRCUITS AND INTEGRATED CIRCUIT WITH OPERATING PARAMETER MONITORING

(75) Inventor: Dominik Weiss, Aerzen (DE)

(73) Assignee: Phoenix Contact GmbH & Co. KG (DE)

( * ) Notice: Subject to any disclaimer, the term of this patent is extended or adjusted under 35 U.S.C. 154(b) by 174 days.

(21) Appl. No.: 13/822,126

(22) PCT Filed: Sep. 14, 2011

(86) PCT No.: PCT/EP2011/004602
§ 371 (c)(1),
(2), (4) Date: May 14, 2013

(87) PCT Pub. No.: WO2012/034682
PCT Pub. Date: Mar. 22, 2012

(65) Prior Publication Data
US 2013/0222006 A1 Aug. 29, 2013

(30) Foreign Application Priority Data
Sep. 14, 2010 (DE) .......................... 10 2010 045 278

(51) Int. Cl.
| | |
|---|---|
| G01R 31/02 | (2006.01) |
| G01R 31/28 | (2006.01) |
| G01R 31/30 | (2006.01) |
| G01R 31/317 | (2006.01) |
| G05B 23/02 | (2006.01) |

(52) U.S. Cl.
CPC ........ *G01R 31/2851* (2013.01); *G01R 31/3016* (2013.01); *G01R 31/31721* (2013.01); *G05B 23/0218* (2013.01); *G01R 31/31725* (2013.01)
USPC .................................................. 324/762.01

(58) Field of Classification Search
USPC ....................... 324/762.01–763.01, 600, 612, 324/629–649, 500, 519–528, 750.15, 750.3, 324/755.01, 756.01, 757.03
See application file for complete search history.

(56) References Cited

U.S. PATENT DOCUMENTS

| | | | |
|---|---|---|---|
| 7,952,370 B2 * | 5/2011 | Ferraiolo et al. | ........... 324/750.3 |
| 2008/0007272 A1 | 1/2008 | Ferraiolo et al. | |
| 2009/0322370 A1 * | 12/2009 | Ware et al. | ..................... 324/763 |

OTHER PUBLICATIONS

Martin Sundin, "Related International Patent Application No. PCT/EP2011/004602 International Search Report", Nov. 29, 2011, Publisher: PCT, Published in: EP.

Examiner: Shi Peng, "Related Chinese Application No. 2011 80044113.6", "Office Action", Jul. 25, 2014, Publisher: SIPO, Published in: CN.

* cited by examiner

*Primary Examiner* — Melissa Koval
*Assistant Examiner* — Trung Nguyen
(74) *Attorney, Agent, or Firm* — Kaplan Breyer Schwarz & Ottesen, LLP

(57) ABSTRACT

A device for monitoring operating parameters of integrated circuits. A signal is generated at least at one output of a comparison element by comparing switching states of input signals at the at least two inputs of the comparison element, which signal indicates that the at least one operating parameter has fallen below or has exceeded a predefined threshold. The two input signals are generated by at least two operating parameter-dependent devices, and the switching behavior thereof is subject to a time delay depending on the current value of the at least one operating parameter. A predefined time delay has a value such that when the predefined threshold of the operating parameter is exceeded, one of the input signals changes its switching state at the times predefined for the comparison element by the clock signal on the basis of the time delay.

12 Claims, 5 Drawing Sheets

APPARATUS FOR MONITORING OPERATING PARAMETERS OF INTEGRATED CIRCUITS AND INTEGRATED CIRCUIT WITH OPERATING PARAMETER MONITORING

FIELD OF THE INVENTION

The invention generally relates to a device for monitoring operating parameters of integrated circuits.

BACKGROUND OF THE INVENTION

Operating parameters considered are in particular operating voltage or voltage supply and/or the operating temperature of integrated circuits.

In order to allow for safe operation of integrated circuits (ICs), thresholds on operating parameters such as supply voltage and/or operating temperature have to be met. If for example the supply voltage falls below or exceeds the admissible or predetermined limit, error-free operation of the IC is no longer ensured. If a defined condition is to be achieved even with a too low supply voltage, a voltage monitor IC is typically used, which monitors the voltage and generates a reset signal when the voltage drops below a predefined threshold.

As voltage supplies become smaller and smaller and have smaller and smaller allowable tolerances, monitoring thereof becomes increasingly difficult and costly. In some cases voltage monitors are used which generate a reset signal only beyond the permissible supply voltage and thus leave small supply voltage ranges in an undefined state.

Voltage monitors commonly employed comprise analog circuits for monitoring the supply voltage. Also known are voltage monitors that are implemented in digital ICs. However, it is more difficult to additionally integrate analog circuits into a digital IC. Accordingly, the integrated voltage monitors are very imprecise and leave undefined a very wide voltage range.

To give an example of the operating voltage of an integrated circuit, the core voltage for the FPGA Cyclone III from Altera (www.altera.com) may be cited. According to the data sheet (manufacturer's information) the admissible range is:
  Maximum: 1.25 V
  Typical: 1.2 V
  Minimum: 1.15 V A typical triggering threshold of the integrated voltage monitor is V=0.77 V. Thus, there is an undefined range from 0.77 V to 1.15 V. In this range, the behavior of the IC is undefined. It cannot be assumed with confidence that the circuit or the FPGA performs its function.

In addition, any voltage monitors increase the cost of a circuit. Especially in case of high volumes, significant cost savings could be realized if external or internal voltage monitors could be dispensed with.

A further disadvantage is that the voltage monitors occupy real estate on a circuit board, printed circuit board or chip surface. Though chip surface is very precious in general, the voltage monitor's surface requirements, moreover, are in contradiction to the general trend towards miniaturization.

Furthermore, the voltage monitors need to be adapted to or calculated for the circuit. Voltage monitors having an undefined range smaller than that indicated in the example above have higher tolerance requirements which increase manufacturing costs.

SUMMARY OF THE INVENTION

Therefore, an object of the invention is to provide monitoring of operating parameter without any undefined range in the operating parameter monitoring, and which is especially suited for being implemented in digital circuits while being inexpensive.

Below, digital circuits refer to any circuits that use integrated components in the broadest sense. Examples of such integrated circuits or components include e.g. microprocessors (μC), CPLDs (Complex Programming Logic Devices), FPGAs (Field Programmable Gate Arrays), ASICs (Application Specific Integrated Circuits), DSPs (Digital Signal Processors), and programmable logics in other configurations such as PLDs (Programming Logic Devices), but also analog circuits that use only a few rather simply configured ICs.

The digital circuits or integrated circuits or components need not be provided actually as real modules, they may also be defined in a more abstract hardware description language such as VHDL (Very High Speed Integrated Circuit Description Language) or Verilog and may be implemented in programmable circuits.

Accordingly, the invention provides a device for monitoring operating parameters of integrated circuits, wherein a signal is generated at least at one output of a comparison element by comparing switching states of input signals at the at least two inputs of the comparison element, which signal indicates that the at least one operating parameter has fallen below or has exceeded a predefined threshold. For this purpose, the two input signals are generated by at least two operating parameter-dependent means, and depending on the current value of the at least one operating parameter the switching behavior thereof is subject to a time delay. A clock signal is applied to both of the two operating parameter-dependent means and serves as a respective input signal for the operating parameter-dependent means. A predefined time delay is created between these input signals of the comparison element, which time delay is generated by a delay element. The delay of the delay element is of such an amount that when the predefined threshold of the operating parameter is exceeded, one of the input signals changes its switching state due to the predefined time delay, at the times predefined for the comparison element by the clock signal. Due to this change, the comparison element can indicate this disparity and thus signals that the threshold of the at least one operating parameter has been exceeded.

It is particularly useful to directly implement the inventive device in the integrated component to be monitored. This ensures that the same operating parameters which act on the operating parameter-dependent means apply as well in the rest of the circuit. Accordingly, the invention also relates to an integrated circuit that includes a device according to the invention. Generally, all operating parameters which influence the switching time act together on the device and determine whether the comparison element indicates that the switching time threshold has been exceeded. The device of the invention thus generally monitors whether the switching times of the integrated circuit which are also affected by manufacturing tolerances fall into a specific range. It will be apparent that this is a great advantage of the device for monitoring operating parameters according to the invention. Accordingly, more generally the device may be referred to as a switching time monitoring device, with the comparison element indicating when the switching time is above or below a respective threshold.

In a particularly preferred embodiment of the inventive device for monitoring operating parameters of integrated circuits, by including the delay element or by adapting the delay element in terms of the delay obtained thereby, the one input signal is delayed such that the predefined rise or hold time of one of the operating parameter-dependent devices is just met, so that when the predetermined threshold of the operating parameter is exceeded, one of the input switching states changes its switching state, and thus the comparison element indicates this disparity and so signals that the threshold of the at least one operating parameter has been exceeded. Therefore, there is no gap in monitoring operating parameters any more. In other words, the time delay should be selected such that when the threshold of the operating parameter to be monitored is reached the setup time of the one operating parameter-dependent device is just met so that the switching state at the output has not yet changed. If this threshold is exceeded, the setup time is no longer met, and the switching state at the output of the operating parameter-dependent device will change. The setup time of the other operating parameter-dependent devices should better be maintained so that this value does not change yet when the threshold is exceeded. However, the time interval from one another may be very short, as long as a different switching state exists between the two signals at the output in the event the operating parameter exceeds the predetermined threshold. In this manner, confident indication of an operating parameter violation is ensured.

In a particularly preferred embodiment of the operating parameter monitoring according to the invention, the two input signals are generated in response to a common clock which is applied to the two operating parameter-dependent means and to the comparison element. This ensures a time-synchronous process flow even in complex integrated circuits.

In a particularly preferred embodiment of the operating parameter monitoring according to the invention, the clock path of the common clock of the two operating parameter-dependent means and of the comparison element is extended using a further delay element, except that of the operating parameters-dependent device whose input is not provided with the delay element, and the further delay element is adapted such that a violation of an upper and lower threshold is indicated. In this manner, a single circuit permits to define upper and lower thresholds not to be violated.

In another particularly preferred embodiment of the device for monitoring operating parameters according to the invention, operating parameter monitoring is implemented in a logic circuit, a microprocessor, a digital signal processor, a CPLD, in an FPGA, and/or in an ASIC or a similar integrated circuit, or more generally, in a PLD. This allows for a more reliable operation of the mentioned circuits than previously, since in case of an operating parameter violation a signal is provided indicating this violation. The implementation may be realized internally or externally. This is to say, according to one embodiment of the invention, the device for monitoring operating parameters according to the invention may be implemented in one of the aforementioned integrated circuits, or may be provided externally of and connected to one of these integrated circuits, or may be part of an electronic circuit including one of these integrated circuits.

In a particularly advantageous embodiment, the operating parameter-dependent delay elements are implemented using D-type flip-flops. Such flip-flops output the signal applied to their input in synchronization with the clock also applied thereto. Depending on the temperature of the IC, the output is delayed. In other words, the flip-flop serves as a measuring instrument or indicator of how quickly the registers in the integrated circuit work.

Furthermore, it is advantageous if the comparison element comprises an exclusive-OR operation or exclusive-OR functionality. Thus, only in case of disparity in the two signal paths a corresponding signal is generated which indicates that the permissible or predefined operating parameters have been violated.

In another preferred embodiment of the inventive device for monitoring operating parameters, the means for providing a derived clock is formed by a frequency divider for the clock signals. By frequency dividers, for example using a flip-flop such as a D-type or T-type flip-flop, a derived signal of half frequency which serves as a derived clock is generated from the common clock. A division ratio of 1/2 is particularly advantageous. But other integer division ratios are likewise possible.

It is also advantageous to additionally use a voltage monitor, for example implemented in an IC, for operating parameter monitoring. It may be activated when the inventive operating parameter monitoring is no longer active. In other words, the inventive operating parameter monitoring is preferably responsible for the range directly beyond the operating parameter thresholds, while the voltage monitor IC detects very large deviations of operating parameters which cannot be detected by the inventive device anymore.

According to one modification of the invention, the signal indicating that operating parameter thresholds have been violated is not directly generated by the comparison element but by one or more intermediate digital filters. This allows for an easy adjustment of the signal, for example in terms of duration or voltage thereof.

Furthermore, it is particularly advantageous if the inventive device is arranged twice, connected in parallel and with different trigger thresholds. In this manner, a hysteresis behavior may be caused for the signal which indicates operating parameter violation. For example, the operating parameter monitoring may be configured with two different trigger thresholds. The circuit with the less sensitive trigger threshold may activate the signal, and when both circuits detect a permissible operating range, the signal can be withdrawn. But it is likewise possible to connect more than two elements. In other words, according to a further embodiment of the invention a circuit is provided comprising at least two operating parameter monitoring devices according to the invention. The circuit may be part of an integrated circuit, or may at least comprise one integrated circuit whose operating parameters are monitored using the two inventive operating parameter monitoring devices. Furthermore it is advantageous if the inventive device comprises a further circuit module with memory functionality for storing the signal which indicates the operating parameter violation. In other words, the inventive device comprises a memory, in particular in form of a further circuit module with memory functionality, for storing the signal that indicates that the at least one operating parameter has fallen below or has exceeded a predefined threshold.

BRIEF DESCRIPTION OF THE DRAWINGS

The invention will now be explained in more detail by way of exemplary embodiments and with reference to the accompanying drawings. The same reference numerals therein refer to the same or to corresponding elements.

In the drawings.

DETAILED DESCRIPTION

Figure 1A:
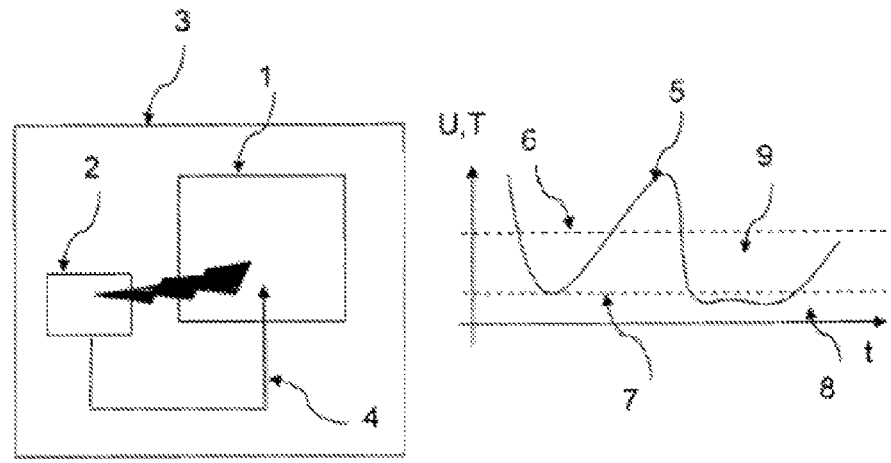
FIG. 1a shows a schematic circuit diagram of an integrated circuit together with a prior art device for monitoring operating parameters. Here, in a particular range outside the permissible or predefined operating parameters the behavior of the IC is undefined, as illustrated in the graph on the right side.

FIG. 1a shows an integrated circuit 1 together with a prior art device 2 for monitoring the supply voltage. Both components are arranged on a circuit board 3. In the event the supply voltage of the IC exceeds a specific threshold, a reset signal 4 is generated. However, a particular voltage range remains in an undefined state, because the supply voltage monitoring device 2 does not cover ranges adjacent the predefined or permissible voltage thresholds of the integrated circuit 1. This is illustrated in the graph on the right side of FIG. 1a. Therein, the current value V of supply voltage is plotted as a voltage function 5 over time t. The lower threshold 6 of the supply voltage of integrated circuit 1 is shown as a dashed line. Also shown is the limit voltage 7 from which on the supply voltage monitoring device 2 intervenes. Thus, only in a range 8 it is ensured that a violation is detected. Range 9 is the range in which integrated circuit 1 operates in an impermissible operating range, which is however not detected by supply voltage monitoring device 2. In this range, correct functioning of integrated circuit 1 cannot be ensured.

If an IC is operated outside its permissible range (for example with too small voltage or too high temperature), the incorporated registers switch more slowly. This results in longer signal propagation times, whereby the setup time (also referred to as rise time) of a subsequent register cannot be met and which thus results in a wrong behavior.

Figure 1B:
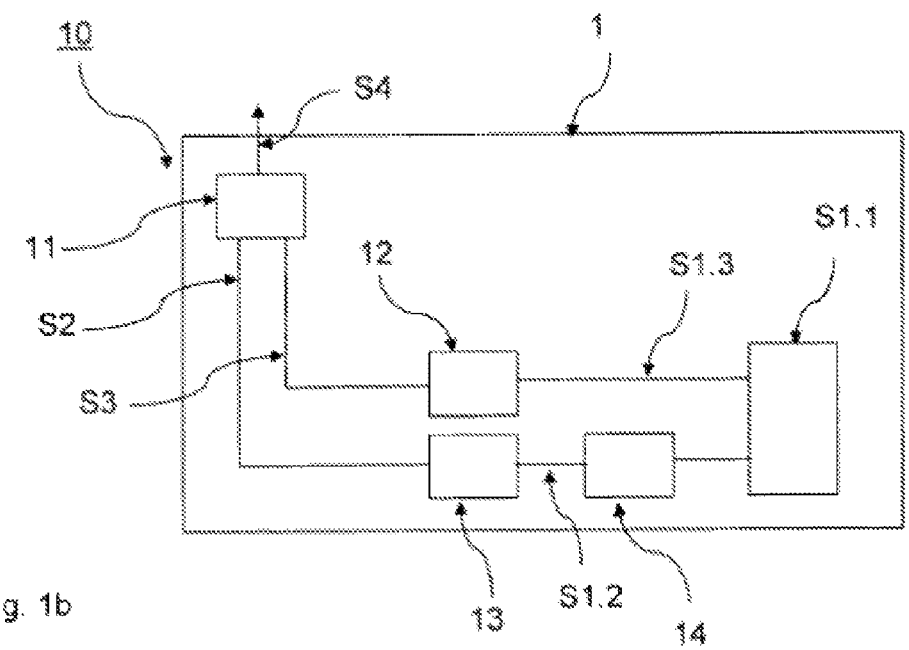
FIG. 1b shows a schematic circuit diagram of an integrated circuit together with a device for monitoring operating parameters according to the invention.

The invention intentionally exploits this behavior in order to detect the condition of impermissible operating range, as illustrated in FIG. 1b. FIG. 1b shows a schematic circuit diagram of an integrated circuit 1 in which a device 10 for monitoring operating parameters according to the invention is implemented. Herein, a comparison element 11 compares switching states of two input signals S2, S3. Input signals S2, S3 are generated by two operating parameter-dependent means 12, 13, and the switching behavior thereof is time-delayed in function of the current value of the at least one operating parameter, for example the supply voltage.

An advantage of the fact that the inventive device is configured of components of the integrated circuit is that the monitoring is subjected as precisely as possible to the same conditions as the actual functionality of the integrated circuit. For example, it may be much hotter inside the IC than outside, further, the supply voltage in the IC may be different from that outside, due to voltage drops in the supply path. Each IC may be affected by manufacturing variations and thus may have slightly different thresholds for the operating parameters. The proposed integrated register-based operating parameter monitoring automatically accounts for such production-related thresholds. Generally, manufacturing tolerances, temperature and supply voltage altogether determine the limits for a correct functioning of an integrated circuit. Since the device according to the invention is directly implemented in the integrated circuit and accordingly responds to changes in operating parameters like the other elements of the circuit, the presence of conditions for a correct functioning of the integrated circuit can be monitored regardless of the type of operating parameter(s).

If this delay is too large, for example due to a drop of the supply voltage, the above-described malfunction of integrated circuit 1 may be caused. Regardless of this delay, comparison element 11 would always indicate that the two input signals S2, S3 are identical, since input signals S2, S3 will currently still be in phase relative to each other. If, however, a delay element 14 is included in operating parameter monitoring device 10 (in FIG. 1b shown upstream operating parameter-dependent device 13, by way of example), the two input signals S2, S3, now, will no longer be in phase. If the amount of delay is selected such that the setup time of this operating parameter-dependent means 13 is just met when the predetermined threshold of the supply voltage is reached, a violation thereof can be detected easily. Namely, if the threshold is violated, the predefined setup time of operating parameter-dependent means 13 will no longer be met, and the switching state at output S3 changes. Since the other operating parameter-dependent means 12 does not exhibit this additional delay, its switching state remains unchanged. Now, however, the two signals S2 and S3 are no longer equal, and comparison element 11 will detect this disparity. Since the time delay is exactly set to the threshold of the setup time, comparison element 11 will exactly indicate when the threshold is violated. This signal may now be further exploited, for example as a reset signal or as a signal for circuits that increase the supply voltage accordingly.

Since the delay of the delay element may be predefined almost arbitrarily, for example by means of a delay line, it may be selected such that one of input signals S2 and S3 changes its state exactly when the threshold of the operating parameter is reached or exceeded.

Figure 2A:
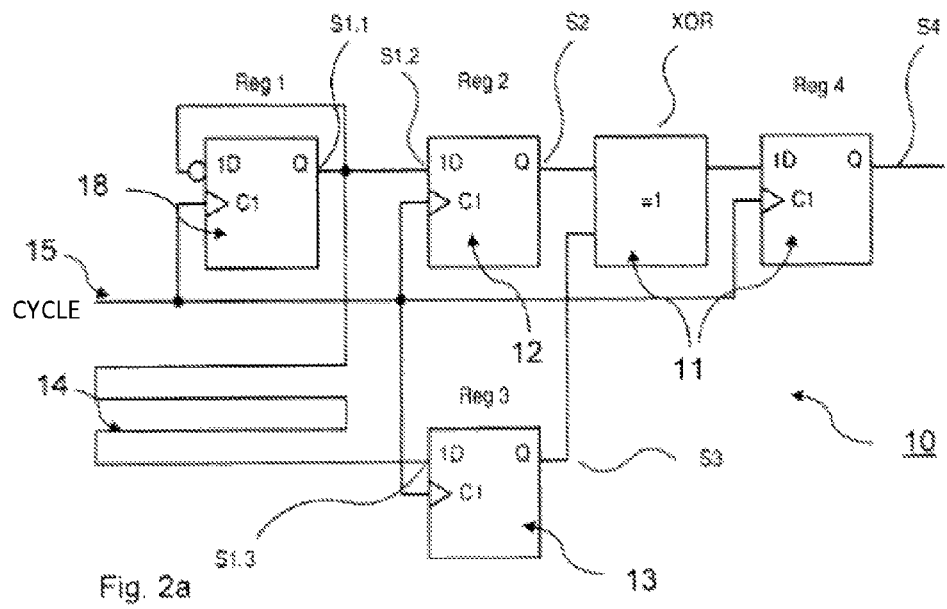
FIG. 2a shows one embodiment of a basic logic circuit for monitoring operating parameters of integrated circuits. Here, in FIG. 2a, the lower threshold of an operating parameter is being monitored.

FIG. 2a shows an exemplary embodiment of such a basic logic circuit for monitoring operating parameters of integrated circuits using appropriate logic modules. For a better comprehension, the individual elements in FIG. 2a are additionally designated with the corresponding reference numerals of FIG. 1b.

Accordingly, in the examples below the comparison element 11 comprises a register Reg 4 and an XOR gate (designated '=1' in the subsequent figures), and the two operating parameter-dependent means 12, 13 are implemented by registers Reg 2 and Reg 3, respectively. Furthermore, a frequency divider 18 is provided, which is implemented by a register Reg 1. In the example illustrated, a D-type flip-flop is used as a register. In order to obtain a frequency division, output Q of register Reg 1 is connected to the input 1D thereof. In this way, the switching state of the flip-flop changes after every switching edge of the clock signal, so that after every second switching edge of the clock signal output Q returns to its initial value.

In the embodiment of FIG. 2a, the operating parameter-dependent means are represented by registers whose switching time changes in function of the value of the operating parameter, as mentioned above. As can be seen from the circuit symbol, D-type flip-flops may be used for the registers. In FIG. 2a, the lower threshold of the operating parameters is monitored. For this purpose, a register (Reg 1 in FIG. 2a) generates, from a clock 15, a second clock signal (S1.1 in FIG. 2a) of half the frequency. The second clock signal S1.1 is stored by two registers, Reg 2, Reg 3, or the two operating parameter-dependent means 12, 13, respectively. Register Reg 3, or operating parameter-dependent means 13, is connected to register Reg 1 via a long connection or delay line 14, so that the setup time thereof (ts3 in FIG. 2b) is just met in the lower permissible operating range. In contrast, register Reg 2, or operating parameter-dependent means 12, is connected to register Reg 1 via a shorter connection line, so that the setup time thereof (ts2 in FIG. 2b) is met with still a large reserve in the lower permissible operating range. Therefore, throughout the permissible operating range the outputs of register Reg 2 and register Reg 3 will have the same status. An exclusive-OR gate XOR (designated '=1' in FIG. 2a) which is connected to the outputs compares output signals S2 and S3 with each other. As long as the signals are equal, the output thereof remains inactive. In addition to registers Reg 2 and Reg 3, register Reg 4 of comparison element 11 is also connected to the clock 15. In response to the clock signal, register Reg 4 samples the exclusive-OR gate XOR.

Figure 2B:
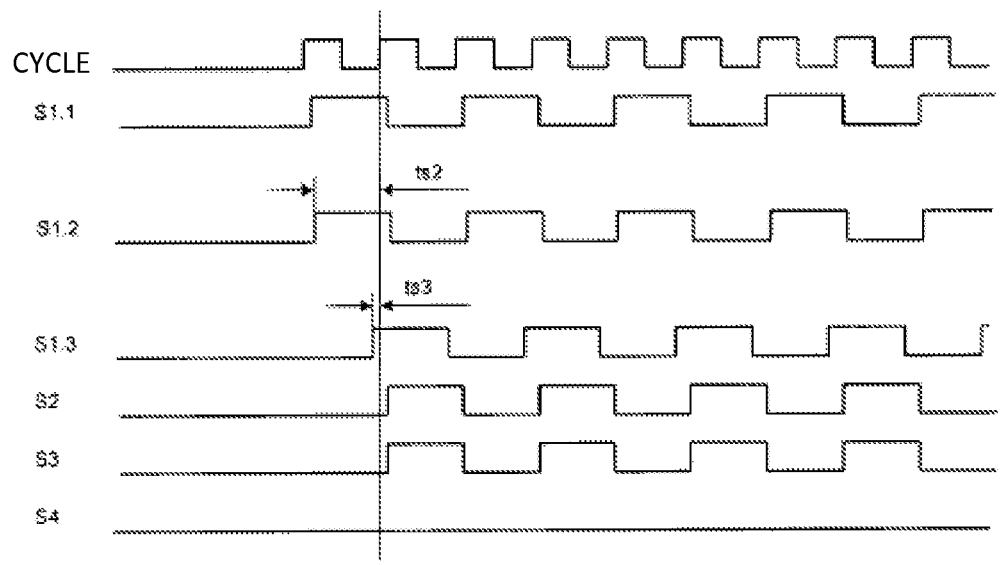
FIG. 2b shows the waveform diagram of the basic logic circuit for monitoring operating parameters shown in FIG. 2a within the permissible or predefined operating range.
Figure 2C:
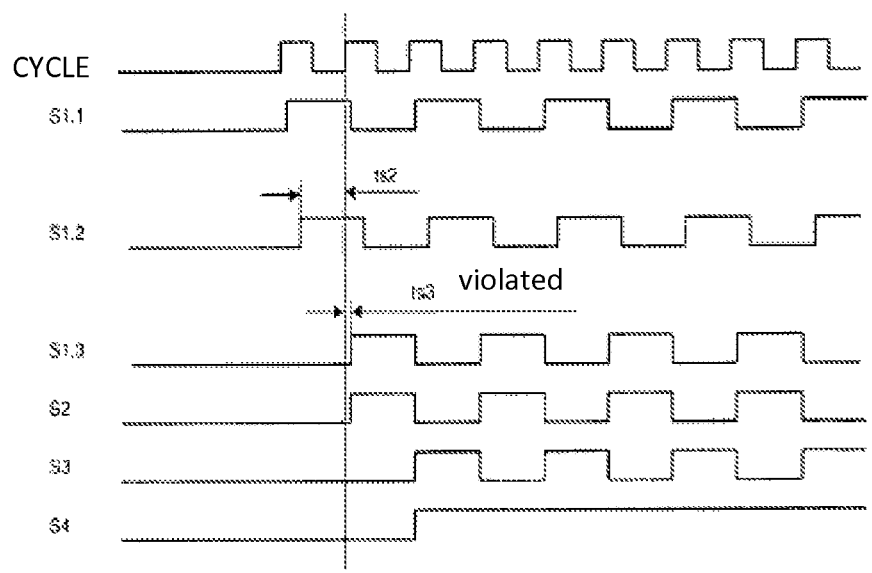
FIG. 2c shows the waveform diagram of the basic logic circuit for monitoring operating parameters of FIG. 2a for the case a lower threshold of the permissible or predefined operating range is violated.

Depending on the value of the operating parameter, the waveforms as shown in FIG. 2b or 2c will result. In FIG. 2b and FIG. 2c, the waveform diagram is plotted over time t. If now the permissible operating range is left, for example because the supply voltage falls below the level required for error-free operation, the waveforms as shown in FIG. 2c will result. As long as the operating parameter varies within the permissible range, the waveforms of FIG. 2b will result. Here, signal S1.1 arrives a bit later at register Reg 2 than S1.2. The setup time ts2 of register 2 Reg 2 decreases, but since it has large reserves, the setup time ts2 will not decrease below the lower limit. The output of register 2, Reg 2, will remain unchanged.

At register Reg 3, the signal also arrives later (S1.3 in FIG. 2b). However, due to the delay line, register Reg 3 has no reserves for its setup time ts3 at the threshold of the operating parameter. In the event the operating parameter leaves its permissible range, the setup time of register Reg 3 will fall below the lower limit, whereby the output signal S3 thereof will be shifted by one clock period.

Now, at the sampling times for the exclusive-OR gate as defined by clock 15 at register Reg 4, the exclusive-OR gate (=1 in FIG. 2a), when comparing signals S2 and S3 will detect a difference. The comparison result S4 is stored by register 4, Reg 4, and can be used as a reset signal.

In other words, the registers are used as measurement registers, i.e. they provide a measure for the rest of the registers of the integrated circuit for determining from which time on the operating parameters in general, or the combination of supply voltage, temperature, and production-related properties of the individual integrated circuit do no longer permit in-time switching.

Figure 3A:
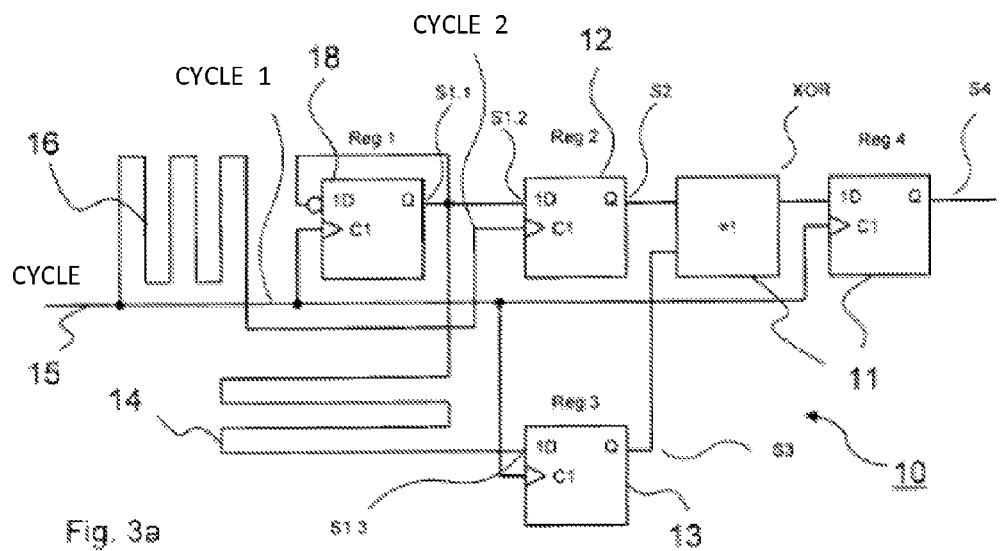
FIG. 3a shows another embodiment of a basic logic circuit for monitoring operating parameters of integrated circuits. Here, in FIG. 3a, the upper and lower thresholds of an operating parameter are being monitored simultaneously.
Figure 3B:
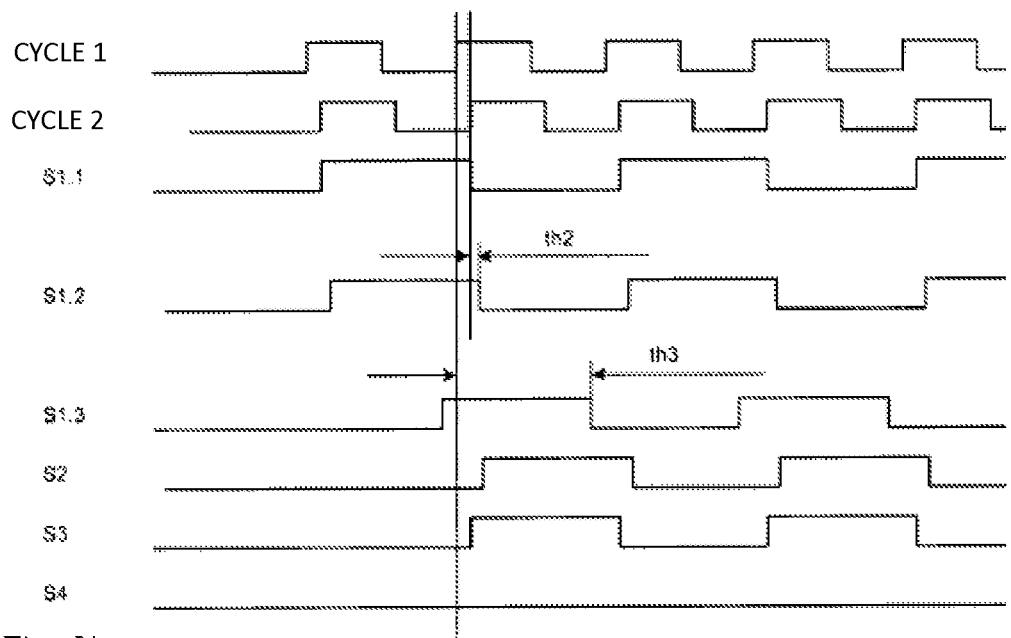
FIG. 3b shows the waveform diagram of the basic logic circuit for monitoring operating parameters shown in FIG. 3a within the permissible or predefined operating range.

The upper threshold of the operating range (excessive supply voltage, too low temperatures) may be similarly monitored according to this principle. In this case, the registers will switch faster and the signal propagation times will reduce. In order that this condition can be detected, register 2 (Reg 2) is connected such that in the upper permissible operating range the hold time thereof can just be met. When exiting the permissible operating range, the hold time is violated. FIG. 3b shows the signals in case of an operation just below the upper limit of the permissible operating range. The hold time th2 is just met, while th3 still has ample reserve.

Figure 3C:
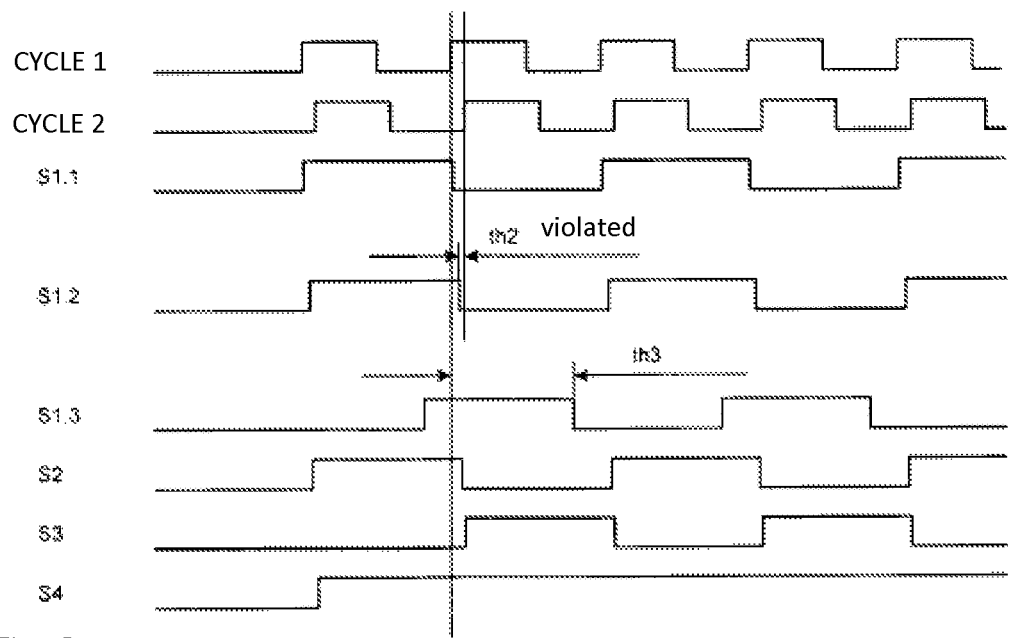
FIG. 3c shows the waveform diagram of the basic logic circuit for monitoring operating parameters of FIG. 3a for the case an upper threshold of the permissible or predefined operating range is violated.

FIG. 3c shows the signals in the case of an operation above the upper limit of the permissible operating range. Hold time th2 is violated, and the output of register 2 is shifted by one clock period. So in this case, too, the exclusive-OR gate (=1 in FIG. 3a) will detect a difference and thus generate a reset signal. In order that in the upper operating range the hold time in register Reg 2 is just met, the connection line thereof to the clock signal is designed to be considerably longer than that of the other registers, using a further delay element 16 (see FIG. 3a in comparison to FIG. 2a). The circuit of FIG. 3a including delay elements 14 and 16 which differently delay the output signals of the two operating parameter-dependent means 12, 13, permits to simultaneously monitor the predefined upper and lower limits of the operating parameter and as such may replace the circuit of FIG. 2a. In summary, the principle of the device according to FIG. 3a thus is based on the fact that with the delay element 14 and the further delay element 16 the input signals of comparison element 11 are delayed relative to each other and to the clock 15 such that when a first, upper threshold value of the operating parameter(s) is exceeded, one of input signals S2, S3 changes its switching state at the times predefined for the comparison element 11 by the clock signal (S1.1), due to the predefined time delay, and when the operating parameter(s) fall(s) below a second, lower threshold value the other one of input signals S2, S3 changes its switching state at the times predefined for the comparison element (11) by the clock signal (S1.1), due to the predefined time delay. One respective delay element 14, 16 is connected upstream of the clock inputs C1 of each operating parameter-dependent means 12, 13.

Both circuits can easily be implemented in an integrated circuit. In an FPGA, the circuit of FIG. 2a is easier to be programmed than that of FIG. 3a.

When the supply voltage falls to such a low level that even the monitoring circuit does no longer work, this can easily be detected by an inaccurate integrated voltage monitoring.

By combining a very simple conventional integrated voltage monitoring and the monitoring presently described, a very cost efficient and yet very accurate monitoring of all operating parameters will be obtained.

A safety margin for the operating parameter monitoring which might be desired may be controlled by adapting the monitoring circuit such that it triggers appropriately early.

Figure 4:
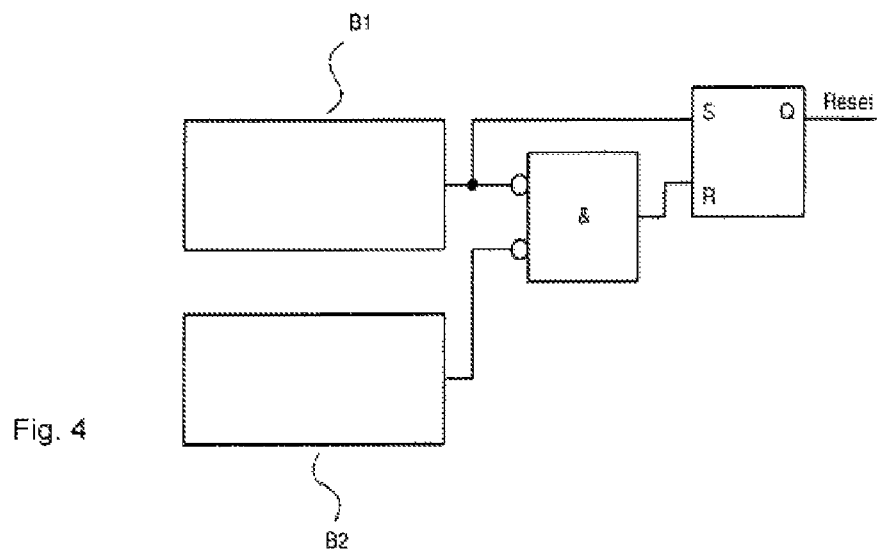
FIG. 4 shows another exemplary embodiment of a basic logic circuit for monitoring operating parameters of integrated circuits. Here, in FIG. 4, two operating parameter monitoring circuits having different trigger thresholds are arranged in parallel.

It is also possible to realize a hysteresis for reset generation by configuring an arrangement of two operating parameter monitoring devices having two different trigger levels (see FIG. 4). The circuit with the less sensitive trigger threshold (B1 in FIG. 4) may enable the reset, and when both circuits (B1 and B2 in FIG. 4) detect a permissible operating range, the reset may be withdrawn.

It is likewise possible that the reset is not directly produced by the operating parameter monitoring, but by an interposed digital filter.

It will be apparent to those skilled in the art that the invention is not limited to the exemplary embodiments described above but may be varied in many ways. For example, more devices for monitoring operating parameters may be arranged side-by-side and may work in parallel, for example in order to monitor the operating parameters at different locations in the integrated circuit.

In particular, the invention may be incorporated and employed in any digital and/or logic circuits. Moreover, the circuit may be easily modified for being operated with negative hold times. Furthermore it will be apparent that the features, whether disclosed in the specification, in the claims, the figures or otherwise, individually define essential elements of the invention, even if they are described in combination with other features.

What is claimed is:

1. A device (10) for monitoring operating parameters, comprising:
   a comparison element for generating an output signal (S4) by comparing switching states of a first input signal and a second input signal (S2, S3) at a first input and a second input, respectively, of the comparison element (11), wherein the output signal indicates that an operating parameter has fallen below or has exceeded a predefined threshold; and
   a first operating parameter-dependent device and a second operating parameter-dependent device for generating the first input signal and the second input signal, respectively, wherein depending on the current value of the operating parameter the switching behavior thereof is subject to a time delay;
   wherein a clock signal (S1.1) is applied to the first and second operating parameter-dependent devices and serves as a respective input signal of the first and second operating parameter-dependent devices; and
   wherein a predefined time delay is created between the first and second input signals (S2, S3) of the comparison element, which is produced by a delay element (14); and
   wherein the delay of the delay element (14) has a value such that when the predefined threshold of the operating parameter is exceeded, one of the first and second input signals (S2, S3) changes its switching state due to the predefined time delay, at the times predefined for the comparison element (11) by the clock signal (S1.1), and so the comparison element (11) indicates this disparity and thus signals that the threshold of the operating parameter has been exceeded.

2. The device (10) for monitoring operating parameters as claimed in claim 1, wherein said one input signal (S1.2, S1.3) with the inclusion of the delay element (14) just meets the predefined rise or hold time of said one operating parameter-dependent device (12, 13), so that when the predetermined threshold of the operating parameter is exceeded, one of the input switching states changes its switching state, and so the comparison element (11) indicates this disparity and thus signals that the threshold of the operating parameter has been exceeded.

3. The device (10) for monitoring operating parameters as claimed in claim 1, wherein the two input signals are generated in response to a common clock (15) which is applied to the two operating parameter-dependent means (12, 13) and to the comparison element (11).

4. The device (10) for monitoring operating parameters as claimed in claim 1, wherein a further delay element (16) is provided, so that with the delay element (14) and the further delay element (16) the input signals of the comparison element (11) are delayed relative to each other and to the clock (15) such that when a first, upper threshold value of an operating parameter is exceeded, one of the input signals (S2, S3) changes its switching state due to the predefined time delay, at the times predefined for the comparison element (11) by the clock signal (S1.1), and when an operating parameter falls below a second, lower threshold value the other one of the input signals (S2, S3) changes its switching state due to the predefined time delay, at the times predefined for the comparison element (11) by the clock signal (S1.1).

5. The device (10) for monitoring operating parameters as claimed in claim 1, wherein the operating parameter monitoring device (10) is implemented internally or externally as a logic circuit, a microprocessor, a digital signal processor, a CPLD, an FPGA, and/or an ASIC.

6. The device (10) for monitoring operating parameters as claimed in claim 1, wherein the operating parameter-dependent means (12, 13) are implemented by D-type flip-flops.

7. The device (10) for monitoring operating parameters as claimed in claim 1, wherein the comparison element (11) comprises an exclusive-OR operation, or exclusive-OR function.

8. The device (10) for monitoring operating parameters as claimed in claim 1, further comprising a frequency divider for providing the clock signals.

9. The device (10) for monitoring operating parameters as claimed in claim 1, comprising a voltage monitor.

10. The device (10) for monitoring operating parameters as claimed in claim 1, comprising at least two operating parameter monitoring means (10) connected in parallel and having different respective triggering thresholds.

11. The device (10) for monitoring operating parameters as claimed in claim 1, further comprising a memory for storing the output signal (S4) which indicates that the operating parameter has fallen below or has exceeded a predefined threshold.

12. An integrated circuit with a device (10) for monitoring operating parameters as claimed in claim 1.

* * * * *